United States Patent
Kano

(10) Patent No.: US 6,445,528 B1
(45) Date of Patent: Sep. 3, 2002

(54) TRANSFORMER AND CASSETTE LIBRARY SYSTEM HAVING THE SAME

(75) Inventor: Yasuaki Kano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/406,528

(22) Filed: Sep. 27, 1999

(30) Foreign Application Priority Data

Sep. 28, 1998 (JP) .......................................... 10-273012

(51) Int. Cl.⁷ ............................................. G11B 15/18

(52) U.S. Cl. ................................................... 360/69

(58) Field of Search ....................... 360/281.1, 281.2, 360/281.3, 281.4, 281.7, 281.8, 72.1, 69; 369/14, 36, 34; 235/487, 449; 336/200; 340/572.1, 572.7

(56) References Cited

U.S. PATENT DOCUMENTS

| | | | |
|---|---|---|---|
| 4,755,783 A | * | 7/1988 | Fleischer et al. .......... 336/84 C |
| 4,959,630 A | * | 9/1990 | Yerman et al. .............. 336/83 |
| 5,781,093 A | * | 7/1998 | Grandmont et al. ........ 336/232 |
| 5,971,281 A | * | 10/1999 | Frary et al. ................. 235/487 |
| 6,195,007 B1 | * | 2/2001 | Takayama et al. ....... 340/572.1 |

* cited by examiner

*Primary Examiner*—David Hudspeth
*Assistant Examiner*—K. Wong
(74) *Attorney, Agent, or Firm*—Jay H. Maioli

(57) ABSTRACT

A transformer for reading information from and writing information to a memory for storing predetermined information, which is mounted on a recording medium cassette, without being in contact with the memory. This transformer is formed as a multi-layer substrate by stacking a plurality of flexible printed substrates each having a predetermined circuit pattern. Thus, the thickness of the transformer and the number of parts thereof are decreased without reducing the sensitivity thereof.

10 Claims, 18 Drawing Sheets

TRANSFORMER AND CASSETTE LIBRARY SYSTEM HAVING THE SAME

BACKGROUND OF THE INVENTION

1. Field of the Invention

The present invention generally relates to a transformer and to a cassette library system having the transformer. More particularly, the present invention relates to techniques for reducing the thickness and the number of parts of a transformer without lowering the sensitivity thereof.

2. Description of the Related Art

Some conventional recording medium cassettes each include an internal memory for storing various kinds of information on the recording medium cassette, for example, a date of manufacture, a manufacturing factory, a title of information recorded on a corresponding recording medium, the name of a file recorded thereon, the specifications and usage conditions thereof, recording locations thereon, or information represented by information signals recorded thereon.

The recording medium cassettes each including such an inner memory are used in, for instance, a cassette library system adapted so that many recording medium cassettes are contained in an accommodating rack and that, if a certain recording medium cassette is required, the required recording medium cassette is taken out of the accommodating rack by a cassette transfer mechanism and then used.

There have been two types of methods for reading information from and writing information to the internal memory included in the recording medium cassette. One is a contact type method, according to which information is read from and written to the internal memory are performed by, for example, bringing an external terminal connected to the internal memory of the recording medium cassette into contact with a connector of a read/write mechanism for performing such read/write operations. The other is a non-contact method, according to which such read/write operations are performed are performed by, for instance, a transformer provided in the read/write mechanism.

FIGS. 17 and 18 show a conventional transformer provided in such a read/write mechanism. Incidentally, this read/write mechanism is adapted to be able to perform both of the contact type method and the non-contact type method of reading information from and writing information to the internal memory.

The transformer a is constituted by coupling a rectangular communication portion b with a connecting portion c placed under this communication portion b. The communication portion b is formed as a multi-layer substrate constituted by connecting a plurality of substrates d, d, . . . , d. The base material of the communication portion b is, for instance, an epoxy resin material.

The connecting portion c is formed by a flexible printed substrate, an end of which is connected to the bottom of one of the substrates d of the communication portion b.

In the transformer a, a predetermined circuit pattern e is formed over the communication portion b and the connecting portion c. A part of this circuit pattern e is formed as a transformer circuit f. This transformer circuit f consists of a coil part g formed like a coil in the connecting portion b and first connection parts h, h respectively connected to both ends of the coil part g. Further, the transformer circuit f is formed by conducting end portions of circuits each formed like a coil on the substrates d, d, . . . d through, for example, through-holes i, i, . . . , i.

In the circuit patterns e, parts j, j, . . . , j, other than parts of the transformer circuits f are formed as second connection parts. An end portion of each of these second connection parts j, j, . . . , j is connected to a corresponding one of lands k, k, . . . , k formed at the bottom portion of the communication portion b.

Both ends of the transformer circuit f and the other end of each of the second connection parts j, j, . . . , j are positioned at connector portions (not shown) provided at the side, which is not connected to the communication portion b, of the connecting portion c. These connector portions are connected to a drive-unit-side connector m provided on the bottom surface of a circuit board of the drive unit (see FIG. 18).

The communication portion b is attached to a holder n having an L-shaped longitudinal section. The holder n consists of a vertical portion o and a horizontal portion p projecting from the bottom edge of the vertical portion o. These portions o and p are formed in such a manner as to be integral with each other. The holder n is rotatably supported by a supporting member (not shown) using an edge part of the horizontal portion p as a rotation fulcrum.

A connector q is attached to a surface of the holder n having the opposite surface, to which the communication portion b is attached. Further, terminals r (only one of which is shown in FIG. 18) of the connector q are connected to the drive-unit-side connector m through the lands k, k, . . . , k of the transformer a and the second connection parts j, j, . . . , j.

Thus, for instance, when a tape cassette s is loaded into a loading portion of the drive unit, a holder n placed at a position (indicated by two-dot chain lines in FIG. 18), where the holder n does not interfere with the tape cassette s, at that time is rotated. Consequently, each of the terminals r, r, . . . , r, of the connector q are connected to the corresponding external terminal that is connected to the memory t included in the tape cassette s.

As a result of connecting the external terminals to the terminals r, r, . . . , r, of the connector q, the system is brought into a state in which information can be read from and written to the memory t through the connector q. Moreover, when the holder n is rotated in a direction, in which the holder n approaches the tape cassette s, and the external terminals connected to the memory t are further connected to the terminals r, r, . . . , r, of the connector q, the communication portion b of the transformer a and the memory t are held in such a way as to be at a predetermined distance. Furthermore, the system is put into a state, in which information can be read from and written to the memory t without bringing the connector into contact with the external terminal.

Meanwhile, in the case of the aforementioned transformer a, the connecting portion c is constituted by a flexible printed substrate so that when the holder n is rotated, the rotation operation is smoothly performed.

However, to enhance the sensitivity by increasing the number of turns of the coil portion g of the transformer circuit f, the communication portion b is formed as a multi-layer by stacking substrates d, d, . . . , d, whose base material is, for instance, an epoxy resin material.

Therefore, the thickness of the communication portion b increases for that. Consequently, the conventional transformer has a drawback in that a larger space is necessary for placing the communication portion b therein Further, the communication portion b and the connecting portion c are formed as different members respectively made of different materials. Thus, the conventional transformer has another drawback in that the number of parts is large and that number of steps of a manufacturing process is large.

SUMMARY OF THE INVENTION

Accordingly, an object of the present invention is to decrease the thickness of a transformer and the number of parts thereof without reducing the sensitivity thereof.

To achieve the foregoing object, according to an aspect of the present invention, there is provided a transformer formed as a multi-layer substrate by stacking a plurality of flexible printed substrates each having a predetermined circuit pattern.

Moreover, to achieve the foregoing object, according to the present invention, there is provided a cassette library system which comprises a transformer formed as a multi-layer substrate by stacking a plurality of flexible printed substrates each having a predetermined circuit pattern, and which reads information from and writes information to a memory t for storing predetermined information, which is mounted on a recording medium cassette, through a communication portion b without bringing an external terminal connected to the memory into contact with a connector connected to lands of the transformer.

Thus, according to the transformer and the cassette library system of the present invention, the thickness of the transformer and the number of parts are reduced.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Hereinafter, preferred embodiments of the present invention will be described in detail by referring to the accompanying drawings.

First, an outline of a cassette library system will be described hereinbelow.

Figure 1:
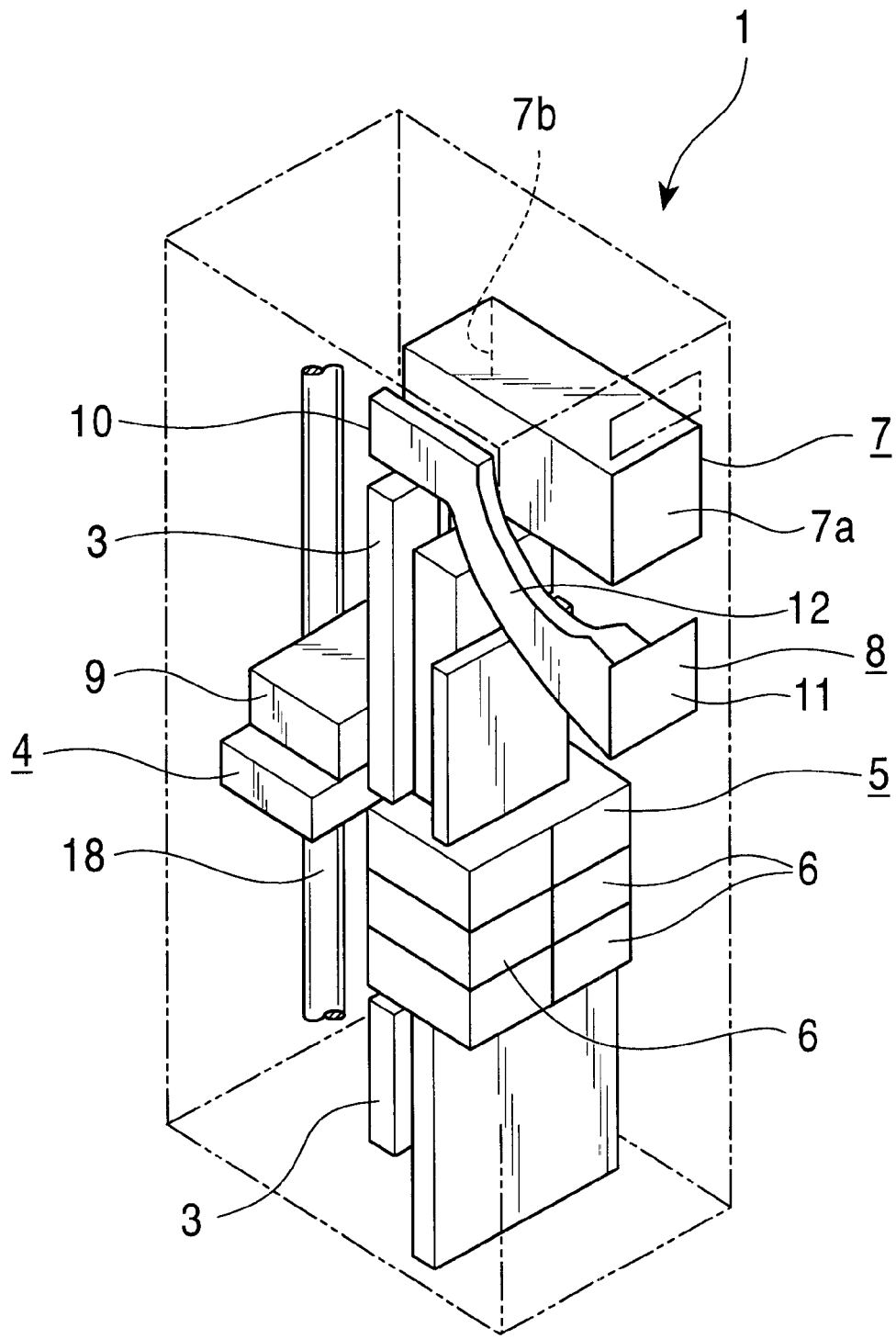
FIG. 1 is a schematic perspective view showing a cassette library system.

A cassette library system illustrated in FIG. 1 uses tape cassettes 2 (see FIG. 2) employing 8-mm wide magnetic tape. Many tape cassettes 2, 2, . . . , 2 are accommodated in a plurality of accommodating racks 3, 3, . . . , 3. A required one of the tape cassettes 2 is taken out by a conveyance mechanism 4, which is adapted to be able to convey a tape cassette 2 up-and-down, side-to-side and to-and-fro, from the accommodating racks 3, 3, . . . , 3. The required tape cassette 2 is then inserted into one of plural tape streamer drives 6, 6, . . . , 6. Data is recorded onto and reproduced from the required tape cassette 2 therein.

Figure 2:
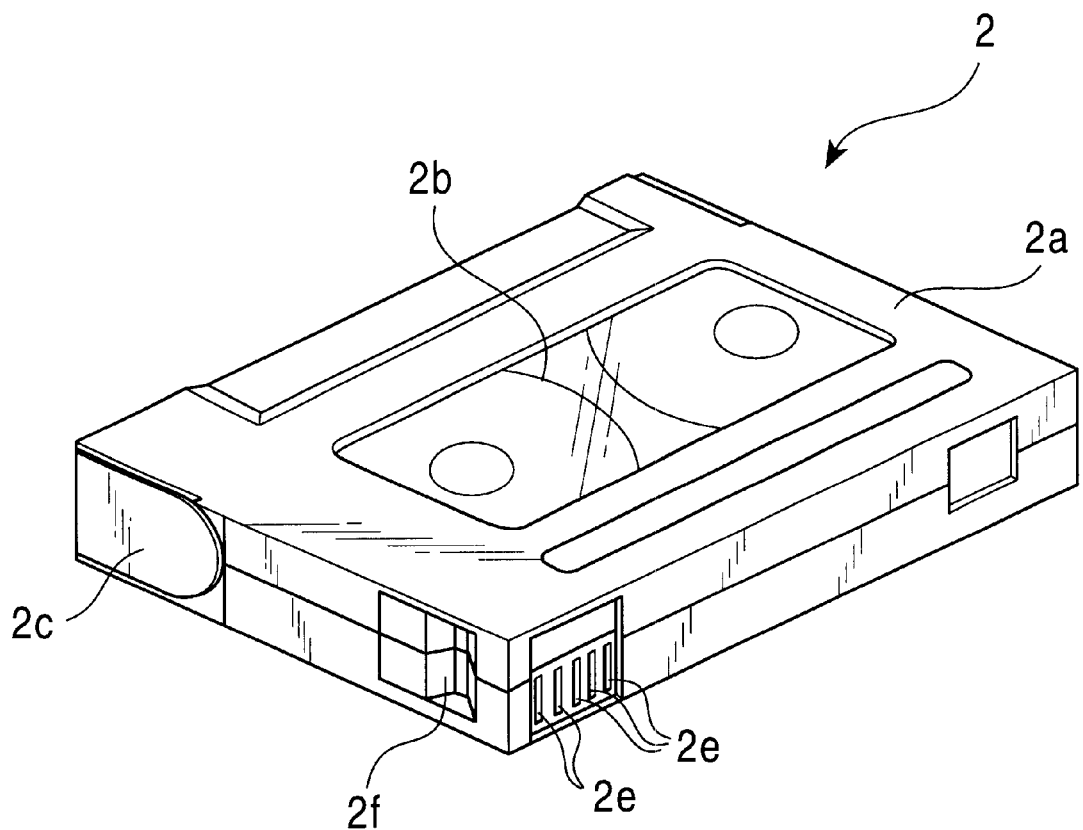
FIG. 2 is an enlarged perspective view showing a tape cassette.

As shown in FIG. 2, the tape cassette 2 is adapted so that a magnetic tape 2b is wound around a pair of tape reels in a case body 2a. A front lid 2c is rotatably supported at the front side of the case body 2a. Further, a memory 2d is incorporated at a predetermined place in the case body 2a. External terminals 2e, 2e, . . . , 2e connected to the memory 2d are placed on the rear surface of the case body 2a. Moreover, recess portions 2f and 2f are formed in rear parts of both the side surface portions of the case body 2a.

In the memory 2d, information on this tape cassette 2 is stored. Such information is, for example, a date of manufacture, a manufacturing factory, a title of information recorded on magnetic tape 2b, the name of a file recorded thereon, the specifications and usage conditions thereof, recording locations thereon, or information represented by information signals recorded thereon.

In the cassette library system 1, an inport 7 and an outport 8 are provided in addition to the aforementioned parts. In the inport 7, a tape cassette 2 inserted from a front inlet 7a is sent to a rear outlet 7b thereof. This tape cassette 2 is taken out by the cassette transfer mechanism 9 of the aforementioned conveyance mechanism 4 at the outlet 7b, and is then accommodated at a predetermined place of one of the accommodating racks 3, 3, . . . , 3.

The outport 8 has a receiving portion 10, a discharging portion 11 and a chute 12 connecting both of these portions 10 and 11. A tape cassette 2 having become unnecessary is taken out by the cassette transfer mechanism 9 from the accommodating rack 3 and to the receiving portion 10. The tape cassette 2 transferred to the receiving portion 10 reaches the discharging portion 11 through the chute 12 and is taken out to the outside at the portion 11.

Figure 3:
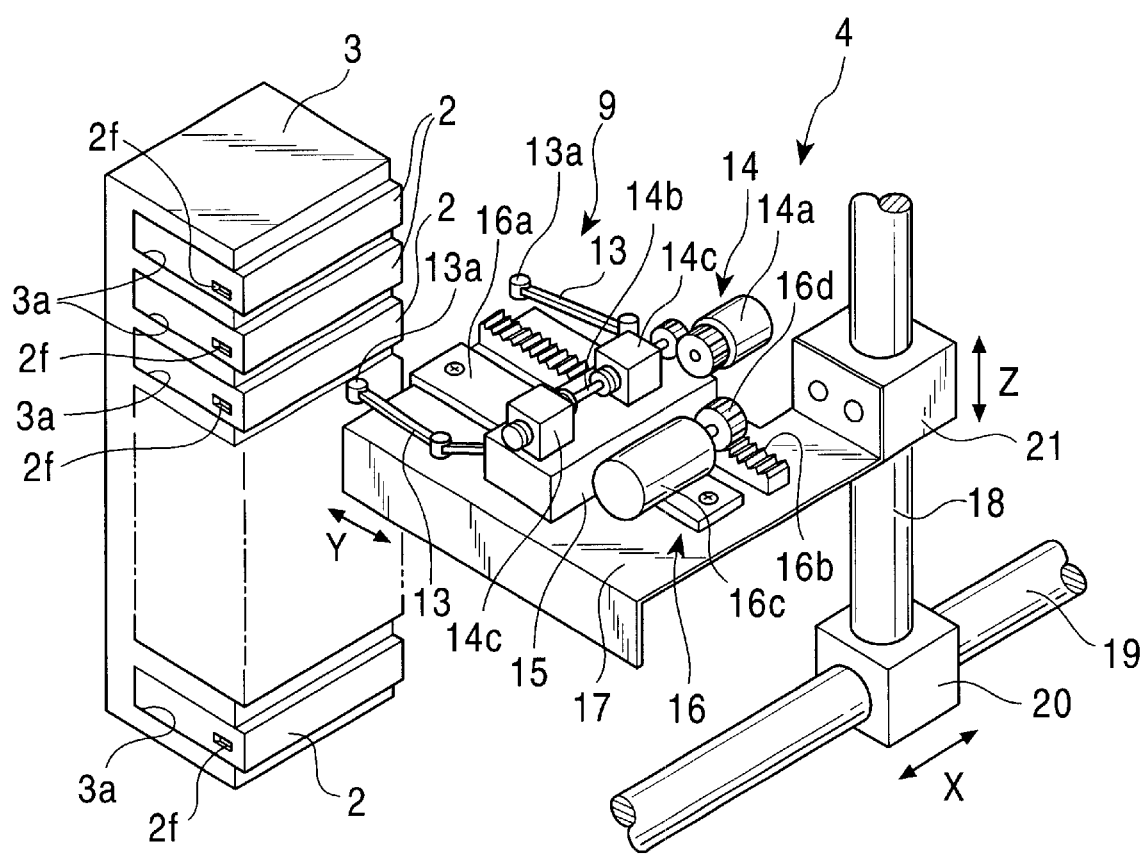
FIG. 3 is a perspective view showing a conveyance mechanism and an accommodating rack.

As shown in FIG. 3, the cassette transfer mechanism 9 comprises a pair of left- and right-hand arms 13, 13, an opening/closing drive mechanism 14, a slider 15, on which the hand arms 13, 13 and the opening/closing drive mechanism 14 are disposed, and a slider drive mechanism 16 for moving the slider 15 in a direction (namely, the direction of Y-axis) in which the slide 15 goes toward or away from the accommodating rack 3 for accommodating the tape cassettes 2, 2, . . . , 2. Further, the cassette transfer mechanism 9 is placed on a base plate 17.

Grips 13a and 13a to be fitted into recess portions 2f, 2f of the tape cassette 2 are provided at the tip end portions of the hand arms 13, 13, respectively.

The opening/closing drive mechanism 14 has a first motor 14a, a rotating shaft 14b rotated through a gear by the motor 14a, and nut elements 14c, 14c supported in such a way as to be able to move in a direction of an axis of rotation of the rotating shaft 14b. The nut elements 14c, 14c are provided in such a manner as to be able to move on the slider 15. Further, the nut elements 14c, 14c are moved in a direction, in which these elements 14c, 14c approach or go away from each other, correspondingly to the direction of rotation of the first motor 14a. The hand arms 13, 13 are adapted to open or close correspondingly to the direction of movement of the nut elements 14c, 14c.

The tape cassette 2 is moved in the direction, in which the hand arms 13, 13 approach each other, and is grasped by fitting the grips 13a and 13a into the recess portions 2f, 2f, respectively. The grasped state of the tape cassette 2 is canceled by moving the hand arms 13, 13 into a direction in which the hand arms 13, 13 go away from each other.

The slider drive mechanism 16 has a rail member 16a for supporting the slider 15 so that the slider 15 can move in the direction of Y-axis, and further has a rack 16b placed in parallel with the rail member 16a, and a second motor 16c. A pinion 16d fixed to the motor shaft of the second motor 16c is engaged with the rack 16b. Further, when the second motor 16c rotates, the slider 15 is moved in a direction (namely, the Y-direction), in which the slider 15 goes toward or away from the accommodating rack 3, correspondingly to the direction of rotation of the motor 16c. As the slider 15 moves, the hand arms 13, 13 are moved in the same direction.

The tape cassette 2 is inserted into or removed from the insertion/removal ports of the accommodating parts 3a, 3a of the accommodating rack 3 and the tape streamer drives 6, 6, . . . , 6 (to be described later).

The conveyance mechanism 4 has a first shaft member 18 extending in the direction of Z-axis shown in FIG. 3, and a second shaft member 19 extending in the direction of X-axis shown in this figure, in addition to the aforementioned cassette transfer mechanism 9. An X-axis table 20 is fixed to an end portion of the first shaft member 18. The X-axis table 20 is supported by the second shaft member 19 in such a way as to be able to move in the direction of the X-axis. Further, an end portion of the base plate 17 is fixed to a Z-axis table 21, which is supported on the first shaft member 18 in such a manner as to be able to move in the direction of the Z-axis.

The X-axis table 20 and the Z-axis table 21 are moved by a movement mechanism (not shown). The movement of the X-axis table 20 causes the conveyance mechanism 4 to move in the direction of the X-axis, while the movement of the Z-axis table 21 causes the conveyance mechanism 4 to move in the direction of the Z-axis.

Figure 4:
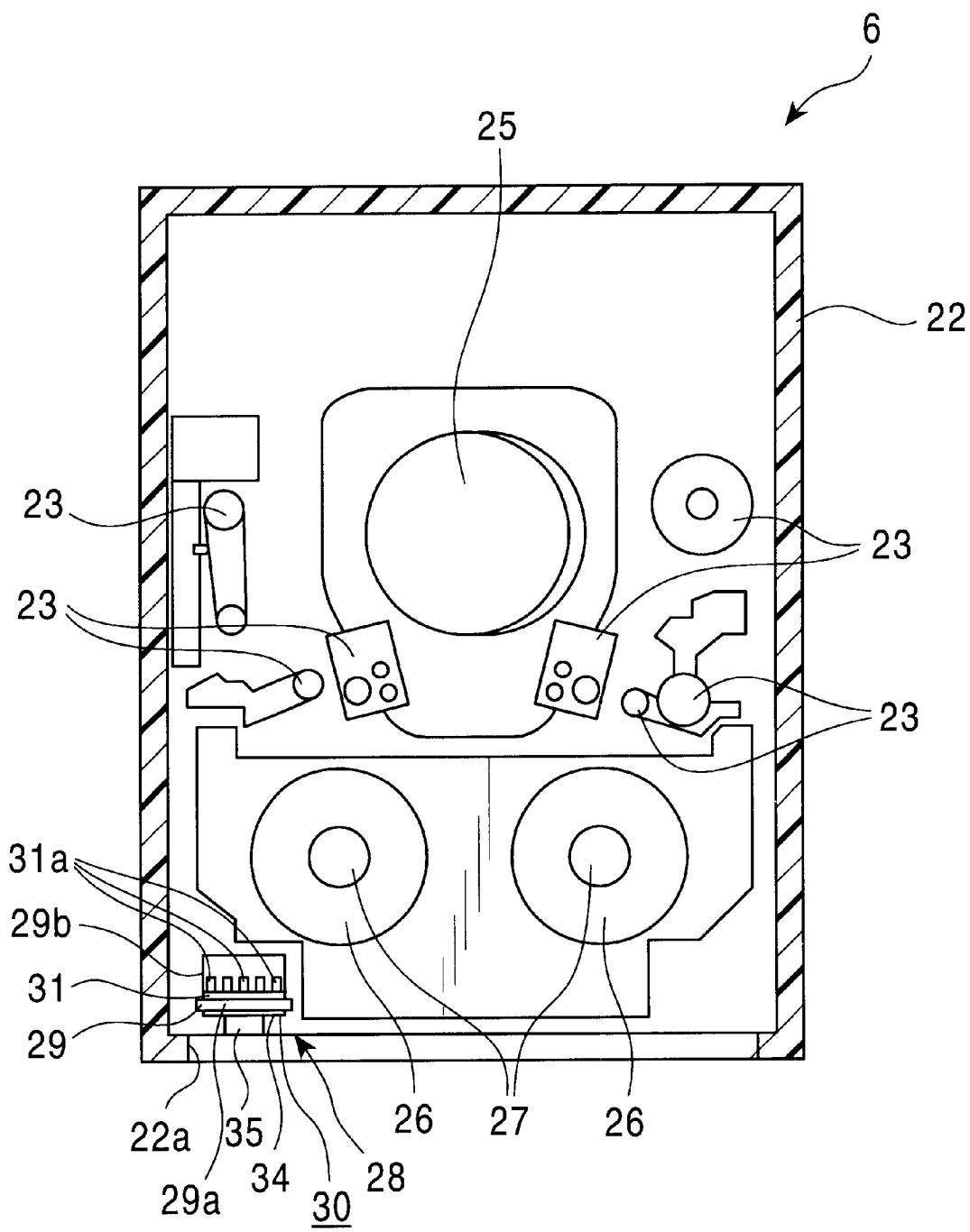
FIG. 4 is a schematic enlarged plan view showing the inside of a drive.
Figure 5:
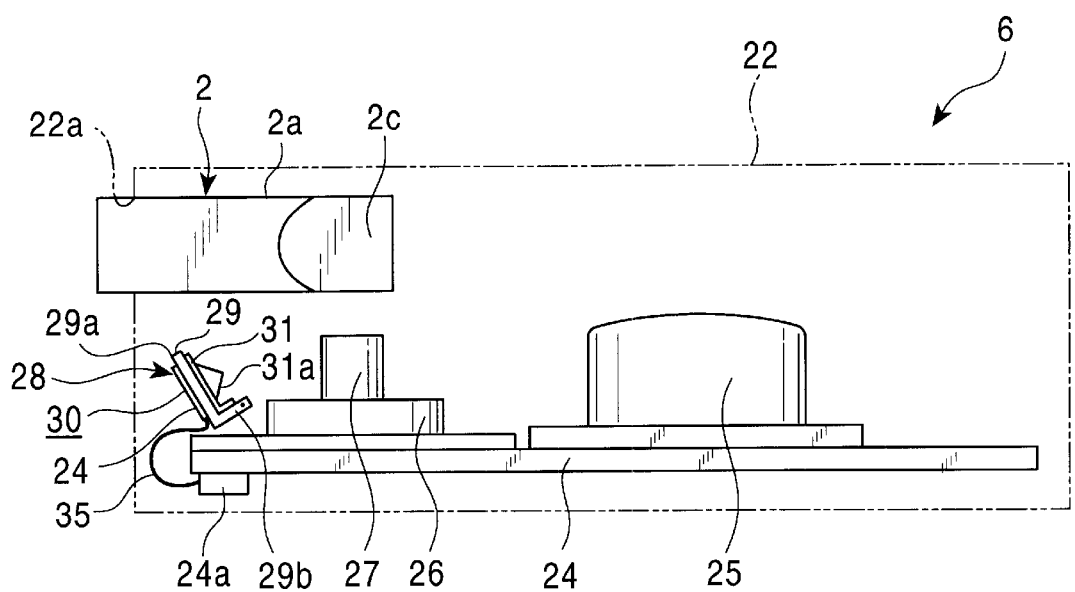
FIG. 5 is a schematic enlarged side view showing a state in which the tape cassette is inserted into the drive.
Figure 6:
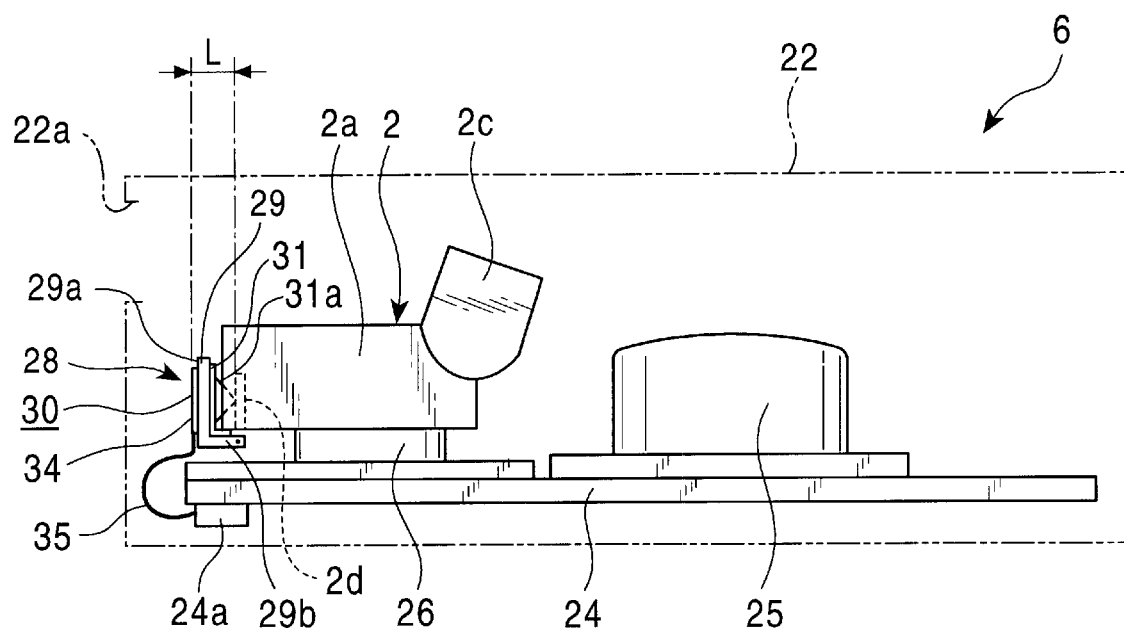
FIG. 6 is a schematic enlarged side view showing a state in which the insertion of the tape cassette into the drive is completed.
Figure 7:
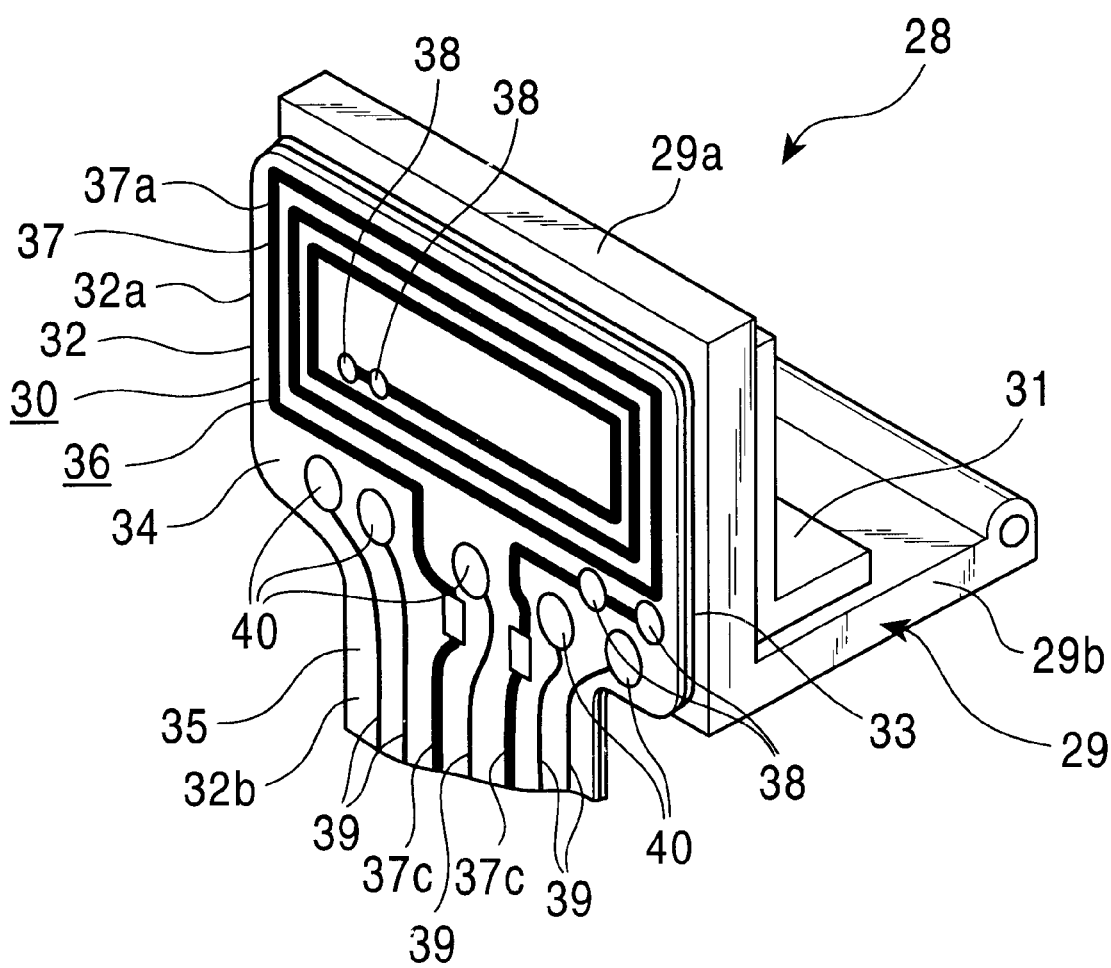
FIG. 7 is an enlarged perspective view showing a primary part of a read/write mechanism.
Figure 8:
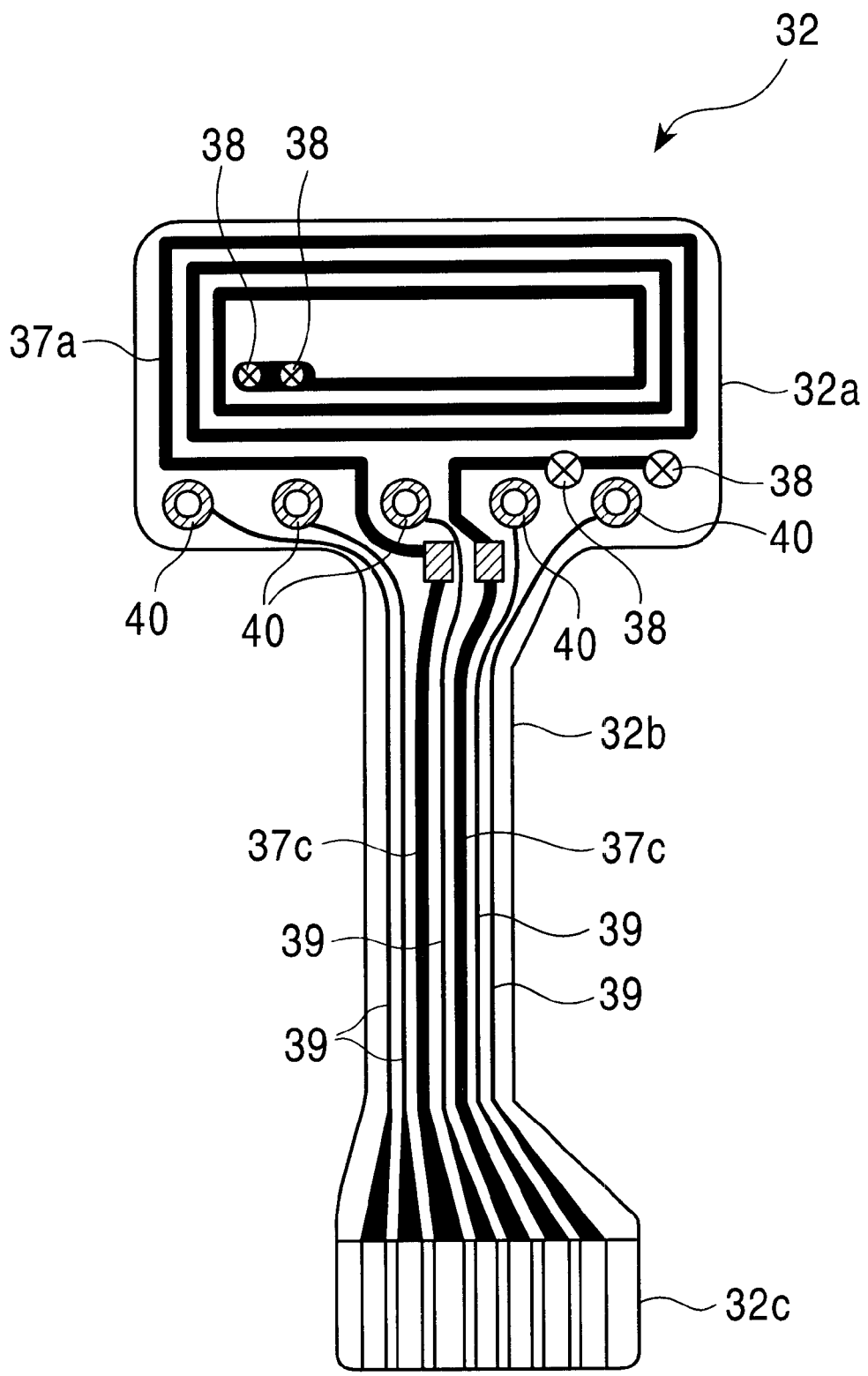
FIG. 8 is an enlarged rear view showing a first substrate.
Figure 9:
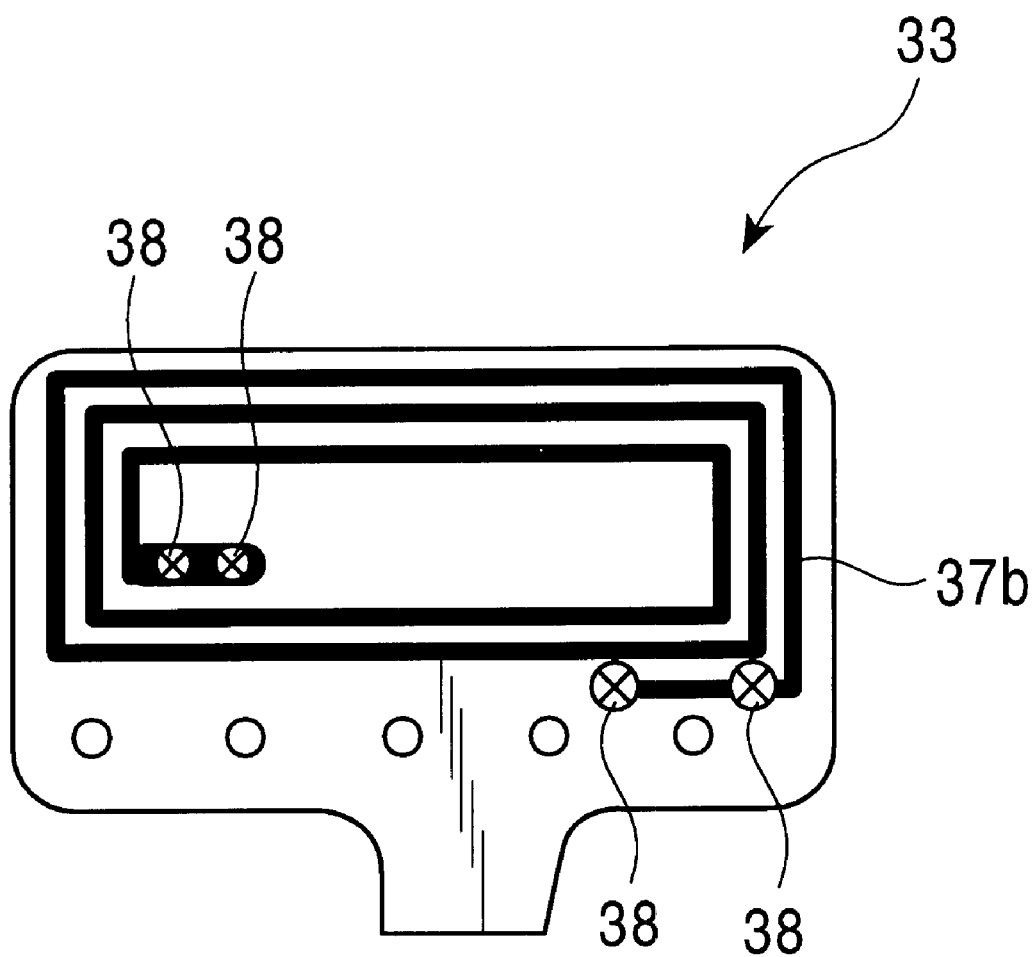
FIG. 9 is an enlarged rear view showing a second substrate.
Figure 10:
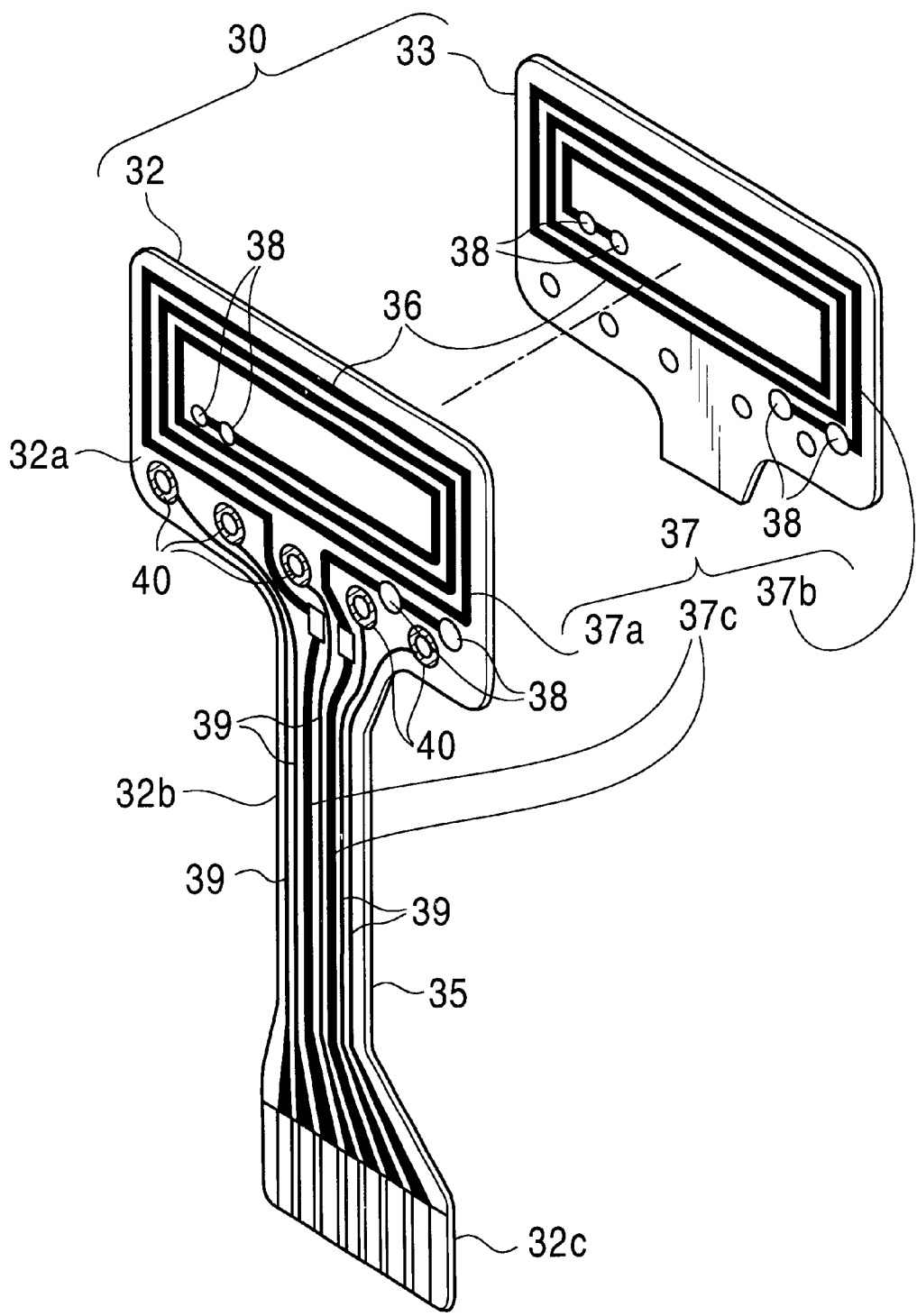
FIG. 10 is an enlarged and exploded perspective view showing a transformer.

In the case of each of the tape streamer drives 6, 6, . . . , 6 of the tape drive portion 5, predetermined members and mechanisms are placed in an outer casing 22 (see FIGS. 4 to 6).

An insertion/removal port for inserting and removing a tape cassette 2 therefrom is formed in a surface portion of the outer casing 22. Further, various kinds of guide members 23, 23, . . . , 23 are provided in the outer casing 22. Furthermore, a circuit board 24 is placed in the outer casing 22. Reel engagement shafts 27, 27 are placed on the circuit board 24 through a rotating drum 25 and reel motors 26, 26.

A read/write mechanism 28 is placed on a side portion at the side of the insertion/removal port 22a of the casing 22. The read/write mechanism 28 serves to read information from and write information to the memory 2d of a tape cassette 2.

The read/write mechanism 28 comprises a holder 28 rotatably supported by a support member (not shown), a transformer 30 attached to the holder 29, and a connector 31 attached to the holder 29 (see FIGS. 4 to 9).

The holder 29 has a L-shaped longitudinal section. A vertical portion 29a and a horizontal portion 29b projecting from the bottom edge of the vertical portion 29a are formed in such a way as to be integral with each other. The holder 29 is rotatably supported by the support member by using an edge portion of the horizontal portion 29b as a rotation fulcrum.

The transformer 30 is constituted by connecting a first substrate 32 and a second substrate 33, both of which are formed from flexible printed substrates. Further, a communication portion 34 is formed by connecting a first square part 32 positioned at an upper portion of the first substrate 32 to the second substrate 33 having nearly the same shape as of the first part 32a. A second part 32b of the first substrate 32 is formed as a connecting portion 35 elongated in a direction.

In the transformer 30, a predetermined circuit pattern 36 is formed over the connection portion 34 and the connecting portion 35. A part of the circuit pattern 36 is formed as a transformer circuit 37.

The transformer circuit 37 comprises a coil portion 37a formed like a coil on the first part 32a of the first substrate 32, another coil portion 37b formed like a coil on the second substrate 33, and first connecting parts 37c, 37c, each of which is connected to an end of a corresponding one of the coil portions 37a and 37b. The first connecting parts 37c, 37c are formed over a region extending from the second part 32b of the first substrate 32 to the bottom end section of the first part 32a thereof. End sections of the first connecting parts 37c, 37c, which are at the side that is not connected to the coil portions 37a and 37b, are placed at a connector section 32c formed at an end section of the second part 32b. Furthermore, the other end parts of the coil portions 37a and 37b are conducted via through-holes 38, 38, . . . , 38 formed in the first substrate 32 and the second substrate 33.

In the circuit pattern 36, portions 39, 39, . . . , 39 are not formed as the transformer circuit 37, but are formed as second connecting parts 39, 39, . . . , 39. Each of the second connecting parts 39, 39, . . . , 39 has an end connected to a corresponding one of lands 40, 40, . . . , 40 formed at the bottom end part of the communication portion 34. Furthermore, the other end of each of the second connecting parts 39, 39, . . . , 39 is placed at the connector section 32c, similarly as the ends of the first connecting parts 37c, 37c.

The connector section 32c of the transformer 30 is connected to the drive-unit-side connector 24a provided on the bottom surface of the circuit board 24 of the tape streamer drive 6 (see FIGS. 5 and 6). Further, the transformer 30 is attached to the back surface of the vertical portion 29a of the holder 29.

The connector 31 is attached to a surface opposite to the surface of the holder 29, to which the communication portion 34 is attached. Further, the terminals 31a, 31a, . . . , 31a of the connector 31 are connected to the drive-unit-side connector 24a through the lands 40, 40, . . . , 40 of the transformer 30 and the second connecting parts 39, 39, . . . , 39. Furthermore, in a state in which the transformer 30 is connected to the drive-unit-side connector 24a, the connecting portion 35 of the transformer 30 is placed in such a manner as to go along one side surface of the circuit board 24 (see FIGS. 5 and 6).

Thus, the tape cassettes 2, 2, . . . , 2 are conveyed by the conveyance mechanism 4 among the outlet port 7b of the inport 7, the receiving portion 10 of the outport 8, the accommodating parts 3a, 3a, . . . , 3a of the accommodating racks 3, 3, . . . , 3, and the tape streamer drives 6, 6, . . . , 6.

When one of the tape cassettes 2 is inserted by the transfer mechanism 9 from the insertion/removal port 22a of one of the tape streamer drives 6, 6, . . . , 6 to a predetermined place (see FIG. 5), the hand arms 13, 13 are moved in a direction in which these arms go away from each other. Thus, the grasped state of the tape cassette 2 is canceled. Subsequently, the tape cassette 2 is automatically drawn into the outer casing 22, so that the tape reels are engaged with the reel engagement shafts 27, 27 (see FIG. 6).

When the tape reels of the tape cassette 2 are engaged with the reel engagement shafts 27, 27, the front lid 2c is rotated. Thus, a part of the magnetic tape 2b is drawn out of the case body 2a by a tape drawing mechanism (not shown). Then, the magnetic tape 2b is wound around the guide members 23, 23, . . . , 23 and the rotating drum 25, so that a predetermined tape path is formed. Consequently, the system is put into a state in which an information signal can be recorded on or reproduced from the magnetic tape 2b. Simultaneously, the holder 29 placed at a position (see FIG. 5), at which the holder 29 does not interfere with the tape cassette 2 when inserted from the insertion/removal port 22a, is rotated by a rotating mechanism (not shown) in a direction in which the holder 29 is brought into contact with the tape cassette 2. Thus, the external terminals 2e, 2e, . . . , 2e connected to the memory 2d included in the tape cassette 2 are connected to the terminals 31a, 31a, . . . , 31a of the connector 31, respectively.

The system is put into a state, in which information can be read from and written to the memory 2d through the connector 31, by connecting the external terminals 2e, 2e, . . . , 2e to the terminals 31a, 31a, . . . , 31a of the connector 31. Further, when the holder 29 is rotated in a direction, in which the holder 29 approaches the cassette 2, and the external terminals 2e, 2e, . . . , 2e connected to the memory 2d are connected to the terminals 31a, 31a, . . . , 31a of the connector 31, the communication portion 34 of the transformer 30 and the memory 2d are held so that the portion 34 is at a predetermined distance from the memory 2d. Consequently, the system is put into a state in which information can be read from and written to the memory 2d through the connection portion 34 without bringing the transformer 30 in contact with the memory 2d.

Therefore, according to either of the contact-type and non-contact type methods, the information concerning the tape cassette 2 can be read from and written to the memory 2d. Such information is, for instance, a date of manufacture, a manufacturing factory, a title of information recorded on magnetic tape 2b, the name of a file recorded thereon, the specifications and usage conditions thereof, recording locations thereon, or information represented by information signals recorded thereon.

Incidentally, when the holder 29 is rotated as described above, the connecting portion 35 of the transformer 30 attached to the holder 29 deforms with such a rotating operation of the holder 29. However, the transformer 30 is formed by using a flexible printed substrate which is rich in flexibility. Therefore, the rotating operation of the holder 29 is smoothly achieved.

Upon completion of recording an information signal on the magnetic tape 2b and reproducing an information signal from the tape 2b, the drawn magnetic tape 2b is accommodated in the case body 2a. Moreover, the holder 29 is rotated in a direction, in which the holder 29 goes away from the tape cassette 2, and a part of the tape cassette 2 is discharged from the insertion/removal port 22a by the ink-jet mechanism (not shown). Further, the tape cassette 9 is grasped by the hand arms 13, 13, and conveyed by the conveyance mechanism 4 to a predetermined place, for example, to one of the accommodating parts 3a of the accommodating rack 3.

As described above, the aforementioned transformer 30 is formed by stacking two flexible printed substrates. Therefore, the number of turns of each of the coil portions 37a, 37a is increased. Thus, the sensitivity of the transformer is prevented from being lowered. Additionally, the thickness of the transformer is reduced to a very small value. Consequently, a space required to place the transformer 30 is reduced.

Moreover, the number of parts is decreased because of the fact that the transformer 30 is formed from two flexible printed substrates.

Meanwhile, non-contact communication (or read/write) methods are presently utilized for making, for example, train tickets and labels attached to VHS (Video Home System) tape cassettes. In the case of employing this method, an antenna size is large. Therefore, a long communication distance, namely, a long distance between the memory and the transformer, which is up to about 50 mm, is permitted.

In contrast, in the case of the method using the aforementioned cassette 2, the antenna size is small. Thus, generally, the communication distance is small, namely, about 20 mm or less.

However, the aforementioned transformer 30 is formed by using only flexible printed substrates. Therefore, the thickness of the communication portion 34 is reduced. Consequently, it is possible to set the communication distance (indicated by "L" in FIG. 6) at 20 mm or less.

Hence, the transformer of the present invention is sufficiently effectively applied to the case of using the memory 2d of the tape cassette 2 corresponding to such a small antenna size. Consequently, information is suitably read from and written to the memory 2d.

In the foregoing description, the embodiment using the transformer 30 formed by two flexible printed substrates (namely, the first substrate 32 and the substrate 33) has been described. The present invention is, however, not limited to such an embodiment. The number of substrates to be connected may be increased within a range in which the space required to place the transformer is not excessively increased and a suitable communication distance is maintained.

Figure 11:
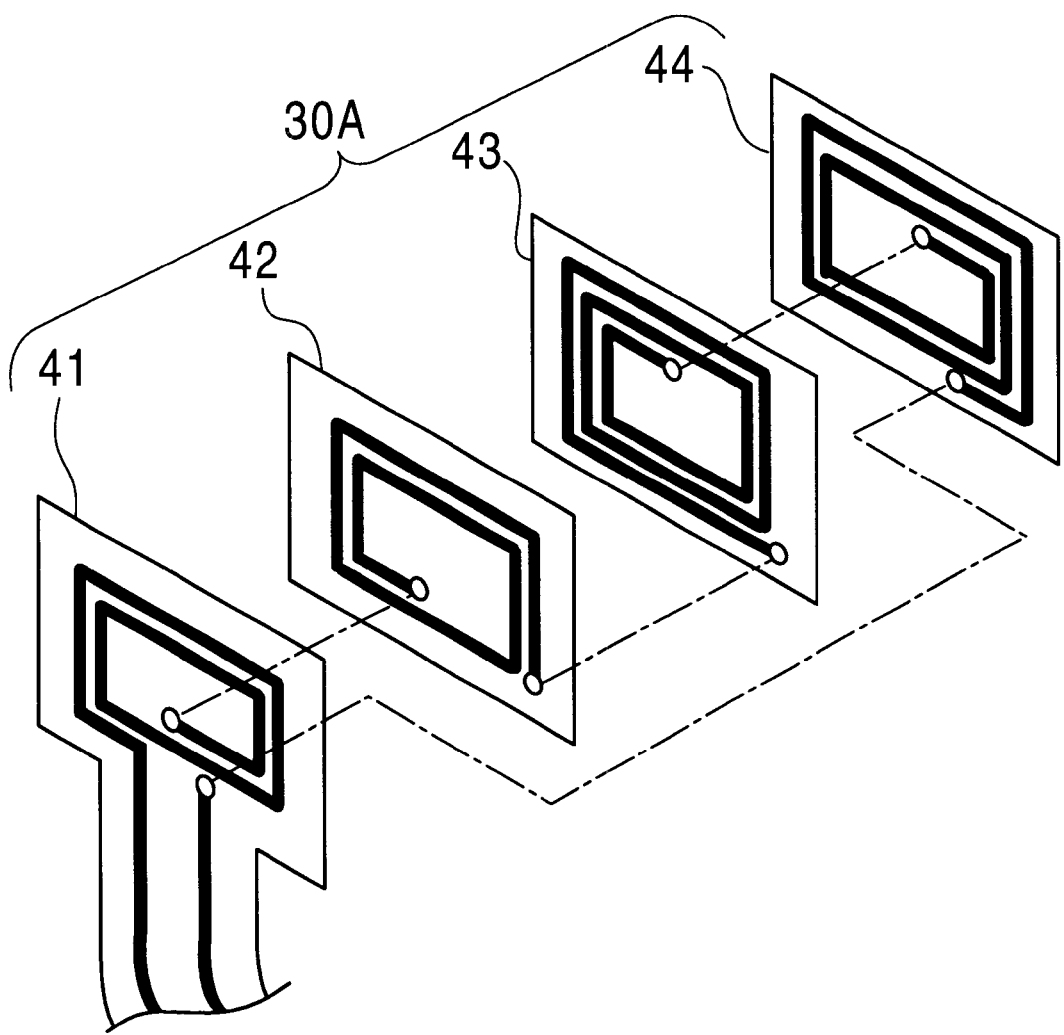
FIG. 11 is a schematic perspective view showing a transformer formed by increasing the number of substrates to be connected.

FIG. 11 shows a transformer 30A formed by increasing the number of substrates to be connected. Namely, the transformer 30A is formed by connecting four flexible printed substrates 41, 42, 43 and 44. As a result of increasing the number of substrates to be connected, the number of turns of each of the coil parts of the transformer circuit can be increased even more. Consequently, the sensitivity thereof is enhanced even more.

FIGS. 12 to 16 illustrate the cases that the read/write mechanism is placed at a position other than those of the tape streamer drives 6, 6, . . . , 6 of the tape drive portion 5.

Figure 12:
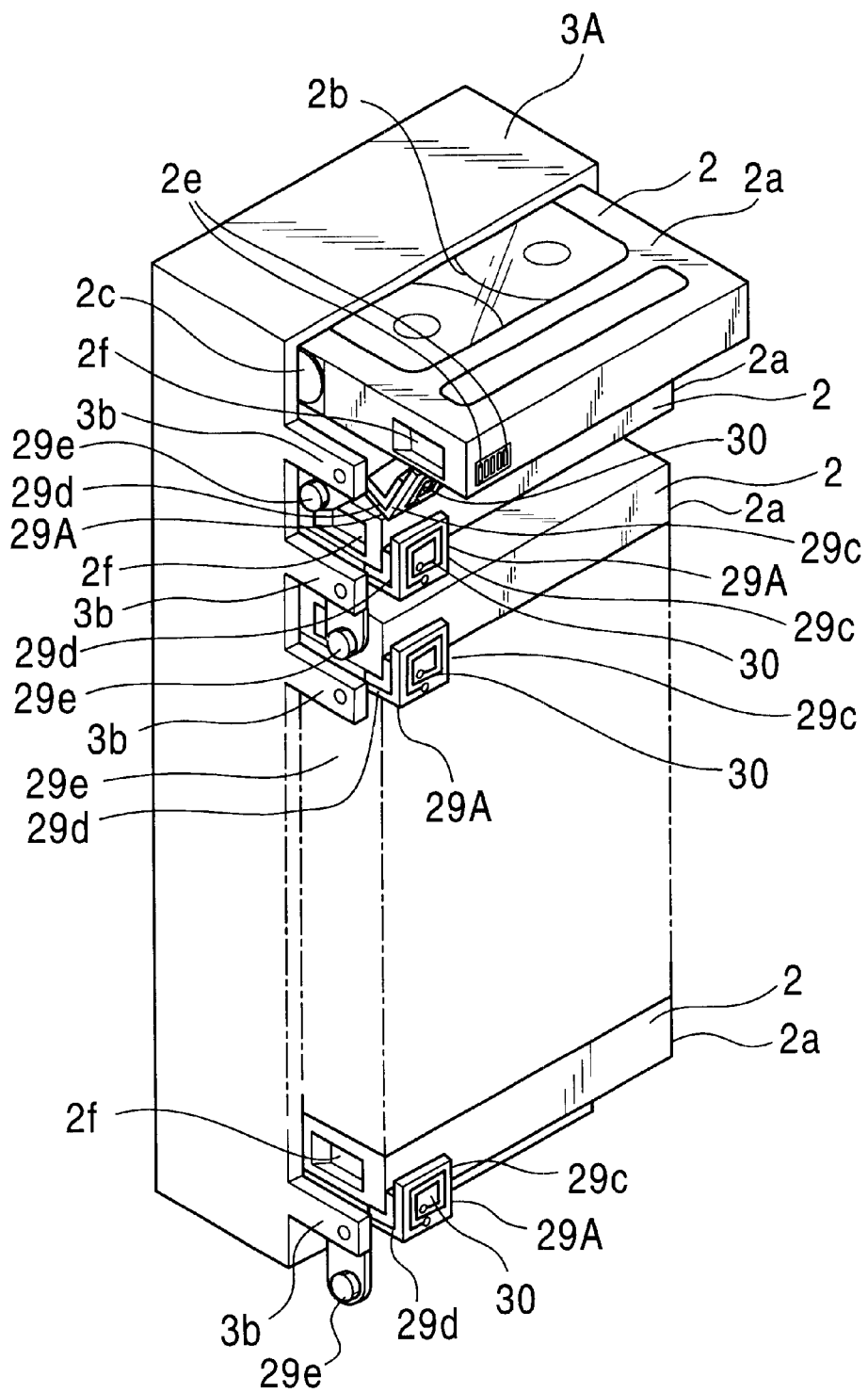
FIG. 12 is an enlarged perspective view showing the accommodating rack provided with the read/write mechanism.

FIG. 12 shows the case that the read/write mechanism is provided in the accommodating rack 3.

In the accommodating rack 3A, supporting parts 3b, 3b, . . . , 3b are formed on the side edge portion thereof respectively correspondingly to the accommodating parts 3a, 3a, . . . , 3a. Holders 29A, 29A, . . . , 29A are rotatably supported by the supporting portions 3b, 3b, . . . , 3b, respectively. Each of the holders 29A, 29A, . . . , 29A comprises a vertical potion 29c, a horizontal portion 29d protruding from the bottom edge of the vertical portion 29c in a direction perpendicular thereto, and an acted portion 29e provided at an end portion of the horizontal portion 29d in such a way as to extend in a direction perpendicular thereto. The vertical portion 29c, the horizontal portion 29d and the acted portion 29e are formed in such a manner as to be integral with one another. Each of the holders 29A, 29A, 29A is supported by the corresponding supporting portion 3b using the end part of the horizontal portion 29d as a rotation fulcrum.

The communication portion 34 of the transformer 30 is attached to the rear surface of the holder 29A. Further, the connector 31 is attached to a surface opposite to the surface, to which the communication portion 34 of the holder 29A is attached, of the holder 29A.

A holder rotating mechanism (not shown) is provided in the base plate 17 of the conveyance mechanism 4. When a tape cassette 2 is inserted into or removed from the accommodating part 3 of the accommodating rack 3 by the cassette transfer mechanism 9, the acted portion 29e of the holder 29A is pressed down by the holder rotating mechanism and rotated in a direction. Thus, the tape cassette 2 is not prevented from being inserted into and removed from the accommodating part 3a (see the state of the holder 29A at the top stage of the accommodating part 3a of FIG. 12). Further, in a state, in which the tape cassette 2 is accommodated in the accommodating part 3a, the holder 29A is rotated in a reverse direction, so that the terminals 31a, 31a, . . . , 31a of the connector 31 are connected to the external terminals 2e, 2e, . . . , 2e of the tape cassette 2.

In the case that the transformers 30, 30, . . . , 30 and the connectors 31, 31, . . . , 31 are respectively provided correspondingly to the accommodating parts 3a, 3a, . . . , 3a, information can be read from and written to the memories 2d, 2d, . . . , 2d, without taking out the tape cassettes 2, 2, . . . , 2 from the accommodating rack 3 by the cassette transfer mechanism 9 and inserting the tape cassettes 2, 2, . . . , 2 into the tape streamer drives 6, 6, . . . , 6. Thus, the efficiency in utilizing an operating time of the transformer is enhanced. Moreover, the easiness in use thereof is increased.

Incidentally, the read/write mechanism may be provided at a predetermined place in the cassette transfer mechanism. Namely, the transformer may be adapted so that when a required tape cassette 2 is grasped by the hand arms 13, 13 of the cassette transfer mechanism 9, the external terminals 2e, 2e, . . . , 2e of the tape cassette 2 are connected to the terminals 31a, 31a, . . . , 31a of the connectors 31, 31, . . . , 31 and then, information is read from and written to the memory 2d.

Thus, as a consequence of providing the read/write mechanism in the cassette transfer mechanism 9, the number of necessary transformers 30 and that of necessary connectors 31 are one. Thus, the number of required parts is decreased. Moreover, information can be read from and written to the memories 2d, 2d, . . . , 2d, without taking out the tape cassettes 2, 2, . . . , 2 from the accommodating rack 3 by the cassette transfer mechanism 9 and inserting the tape cassettes 2, 2, . . . , 2 into the tape streamer drives 6, 6, 6. Thus, the efficiency in utilizing an operating time of the transformer is enhanced. Furthermore, the easiness in use thereof is increased.

Figure 13:
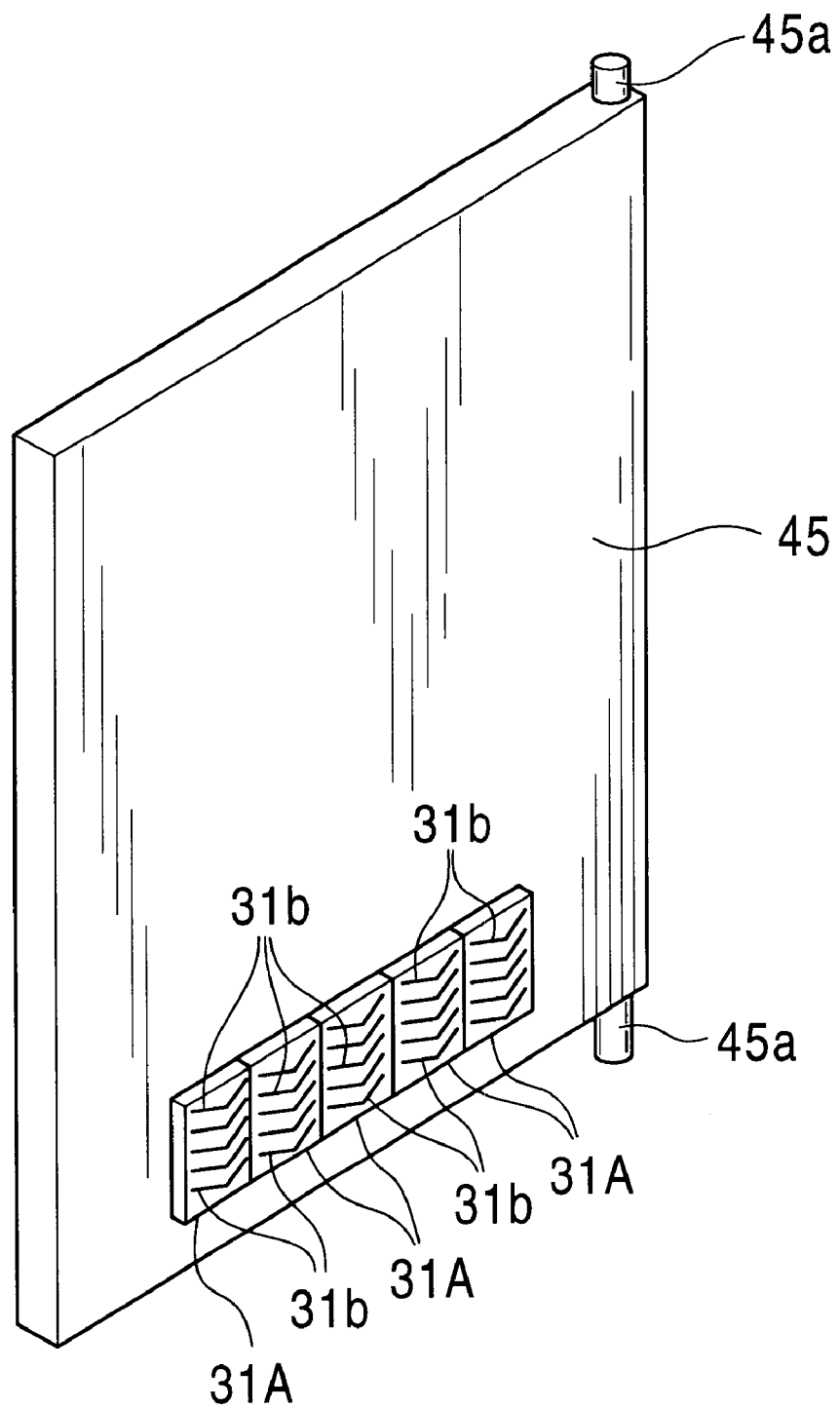
FIG. 13 is an enlarged perspective view showing a door element provided with the read/write mechanism.

FIG. 13 illustrates the case that the read/write mechanism is provided on the door element of the inport 7.

The inport 7 has a cassette transfer case (not shown) in which 5 rows of tape cassettes 2, 2, . . . , 2 each oriented in a longitudinal direction are accommodated. The tape cassettes 2, 2, . . . , 2 are sent from the inlet 7a to the outlet 7b of the inport 7 by the movement of the cassette transfer case in the inport 7, and taken out therefrom at the outlet 7b by the cassette transfer mechanism 9 of the aforementioned conveyance mechanism 4. Further, the tape cassettes 2, 2, . . . , 2 are inserted into the cassette transfer case at the inlet 7a of the inport 7. The inlet 7a is opened and closed by the door element 45.

The door element 45 is supported at the inlet of the inport 7 through the shafts 45a, 45a in such a manner as to be freely opened and closed. The connectors 31A, 31A, . . . , 31A are attached to places, which correspond to 5 tape cassettes 2, 2, . . . , 2 respectively corresponding to the cassette transfer cases, on the inner surface of the door element 45. Further, the transformers 30, 30, . . . , 30 (not shown) are placed on the connectors 31A, 31A, . . . , 31A, respectively.

The system is adapted so that when the door element 45 is closed, the external terminal 2e, 2e, . . . , 2e of the tape cassettes 2, 2, . . . , 2 are in contact with the terminals 31b, 31b, . . . , 31b of the connectors 31A, 31A, . . . , 31A, respectively.

In the case that the transformers 30, 30, . . . , 30 and the connectors 31, 31, . . . , 31 are provided on the door element 45, information can be read from and written to the memories 2d, 2d, . . . , 2d when the tape cassettes 2, 2, . . . , 2 are inserted from the inlet 7a of the inport 7. Thus, at a stage before tape cassettes are inserted thereinto, it is possible that the tape cassettes 2, 2, . . . , 2 need to be inserted are distinguished from unnecessary tape cassettes 2, 2, . . . , 2. Consequently, the efficiency in utilizing an operating time of the transformer is enhanced. Furthermore, the easiness in use thereof is increased.

Incidentally, although the transformers 30, 30, . . . , 30 are placed together with the connectors 31, 31, . . . , 31 on the door element 45, only the transformers 30, 30, . . . , 30 may be provided thereon without providing the connectors 31, 31, 31.

Figure 14:
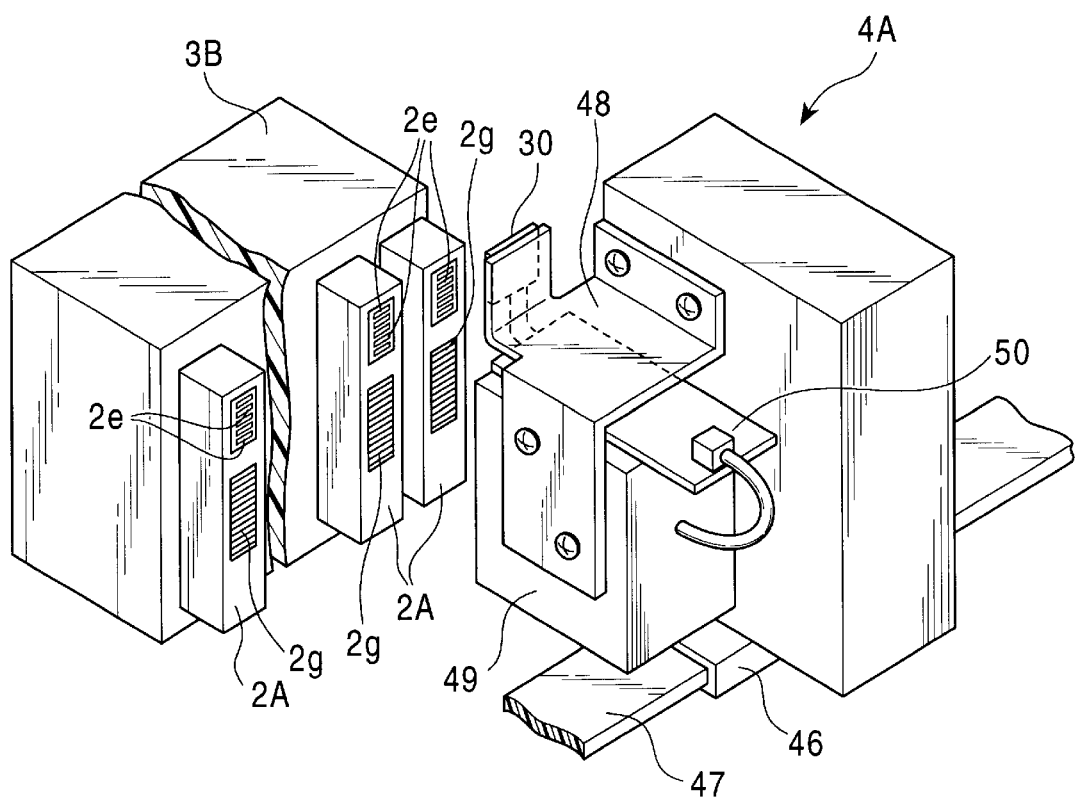
FIG. 14 is a schematic enlarged perspective view showing a conveyance mechanism provided with the read/write mechanism and a bar code reader.

FIG. 14 illustrates the case that the read/write mechanism is provided in a conveyance mechanism 4A.

Although this figure shows the case that the tape cassettes 2A, 2A, . . . , 2A are arranged in a lateral direction in the accommodating rack 3A and that the conveyance mechanism 4A moves in the lateral direction, the system may be adapted so that the tape cassettes 2A, 2A, . . . , 2A are arranged in a longitudinal direction and the conveyance mechanism 4A moves in the longitudinal direction.

Bar-code cards 2g, 2g, . . . , 2g are bonded to the rear surfaces of the tape cassettes 2A, 2A, . . . , 2A, respectively.

The conveyance mechanism 4A is movably supported on a rail 47 through a movable carriage 46, and has a cassette transfer mechanism (not shown). A bar-code reader 49 is mounted on the conveyance mechanism 4A through a mounting plate 48. The bar-code reader 49 is connected to a circuit board 50 placed thereabove.

The transformer 30 is connected to a part of the mounting plate 48. The transformer 30 is placed in such a way as to face the tape cassettes 2A, 2A, . . . , 2A accommodated in the accommodating rack 3B when the conveyance mechanism 4A is moved.

Thus, when the conveyance mechanism 4A is moved and positioned correspondingly to the required tape cassette 2A, the transformer 30 is positioned by facing the external terminals 2e, 2e, . . . , 2e of the tape cassette 2A. Moreover, the bar-code reader 49 is positioned in such a manner as to face the bar-code card 2g. Consequently, information can be read from and written to the memory 2d of the tape cassette 2A. Furthermore, information recorded on the bar-code card 2g can be read by the bar-code reader 49.

As described above, information recorded on the bar-code card 2g can be read by the bar-code reader 49. However, usually, an amount of information recorded on a bar-code card 2g is small. Moreover, after the bar-code card 2g is once formed, information cannot be written to this bar-code card.

The amount of information, which can be recorded on the card, is increased by enabling the transformer 30 to read information and write information to the memory 2d of the tape cassette 2A, in addition to the reading of information recorded on the bar-code card 2g by means of the bar-code reader 49. Moreover, information can be further written to the card.

Furthermore, information can be read from and written to the memories 2d, 2d, . . . , 2d without taking out the tape cassettes 2A, 2A, . . . , 2A from the accommodating rack 3B by the cassette transfer mechanism 9 and inserting the tape cassettes 2, 2, . . . , 2 into the tape streamer drives 6, 6, . . . , 6. Thus, the efficiency in utilizing an operating time of the transformer is enhanced. Further, the easiness in use thereof is increased.

Figure 15:
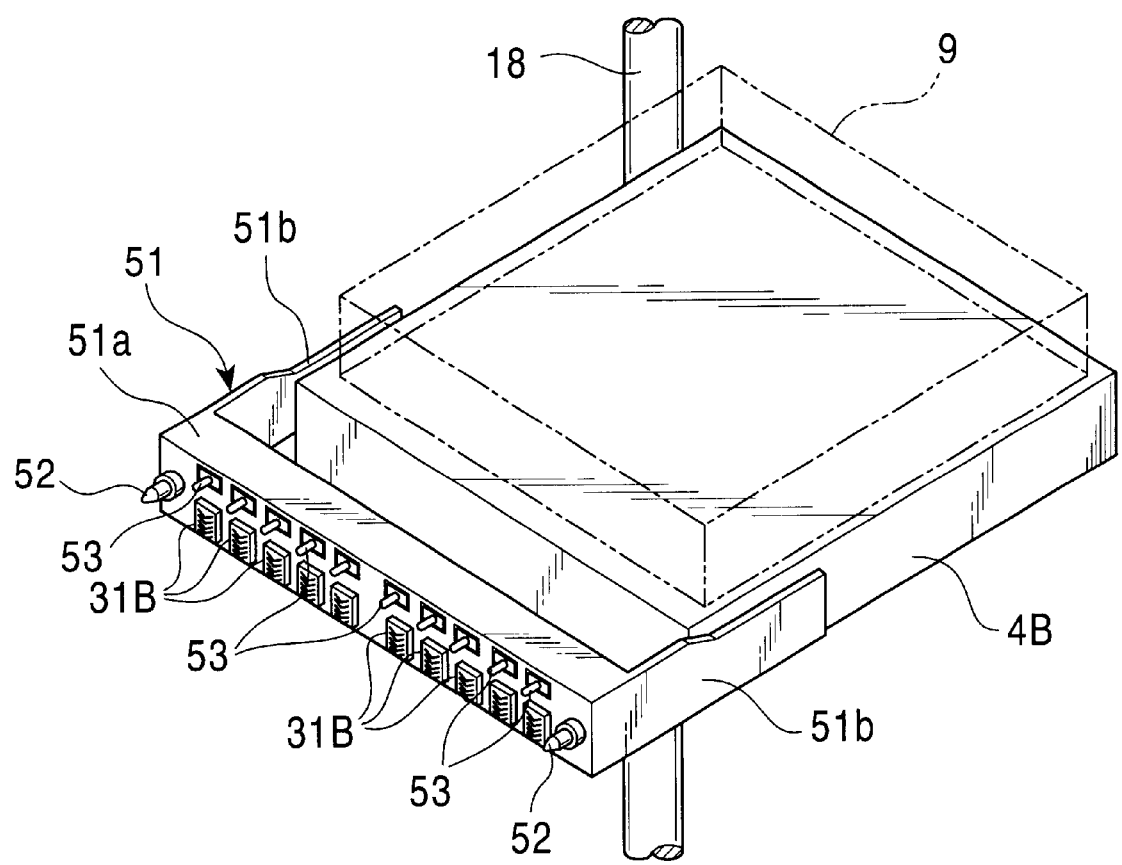
FIG. 15 is a schematic enlarged view showing a conveyance mechanism provided with a stamper having the read/write mechanism.

FIG. 15 illustrates the case that the read/write mechanism is provided in the conveyance mechanism and that information can be read from and written to a plurality of tape cassettes.

The conveyance mechanism 4B has a cassette transfer mechanism 9. A stamper 51 is supported by the base plate 17 in such a manner as to be able to move in a direction in which the stamper 51 goes toward and away from the tape cassettes accommodated so that the cassettes are arranged in a transversal direction in an accommodating rack (not shown). The stamper 51 comprises a connector placing portion 51a, and supported portions 51b, 51b projecting from the left and right side edges of the connector placing portion 51a. The supported portions 51b, 51b are movably supported by the base plate 17.

Positioning pins 52, 52 are protruded from the left and right front end portions of the connector placing portion 51a. Further, cassette detecting sensors 53, 53, . . . , 53 are provided on an upper portion of the connector placing portion 51a, and connectors 31B, 31B, . . . 31B of the number, which is equal to that of the sensors 53, 53, . . . , 53, are provided at places respectively corresponding to the sensors 53, 53, . . . , 53 on a lower portion thereof so that a line of the sensors 53 is spaced apart from a line of the connectors 31B, 31B, . . . , 31B. Further, each of transformers 30, 30, 30 (not shown) is placed on the rear surface of the corresponding one of the connectors 31B, 31B, . . . , 31B.

Thus, when the stamper 51 is moved in a direction in which the stamper 51 approaches the accommodating rack, the positioning pins 52, 52 are inserted into positioning holes formed in the accommodating rack. Consequently, the positioning of the connectors 31B, 31B, . . . , 31B and that of the external terminals 2e, 2e, . . . , 2e of the tape cassettes 2, 2, . . . , 2 contained in the accommodating rack are performed. As a result, the connectors 31B, 31l, . . . , 31B are connected to the external terminals 2e, 2e, . . . , 2e, respectively. At that time, simultaneously, the presence of the tape cassettes 2, 2, . . . , 2 is detected by the cassette detecting sensors 53, 53, . . . , 53.

Thus, the reading/writing of information can be simultaneously performed on a plurality of tape cassettes 2, 2, . . . , 2 by providing the stamper 51 in the conveyance mechanism 4 and further providing the transformers 30, 30, . . . , 30 and the connectors 31B, 31B, . . . , 31B on the stamper 51. Consequently, the operating time of the system is reduced.

Moreover, information can be read from and written to the memories 2d, 2d, . . . , 2d, without taking out the tape cassettes 2, 2, . . . , 2 from the accommodating rack 3 by the cassette transfer mechanism 9 and inserting the tape cassettes 2, 2, . . . , 2 into the tape streamer drives 6, 6, . . . , 6. Thus, the efficiency in utilizing an operating time of the transformer is enhanced. Furthermore, the easiness in use thereof is increased.

Incidentally, although the transformers 30, 30, . . . , 30 are provided on the stamper 51, together with the connectors 31, 31, . . . , 31, it is possible that, for instance, only the transformers 30, 30, . . . , 30 are provided thereon without providing the connectors 31, 31, . . . , 31 thereon.

Figure 16:
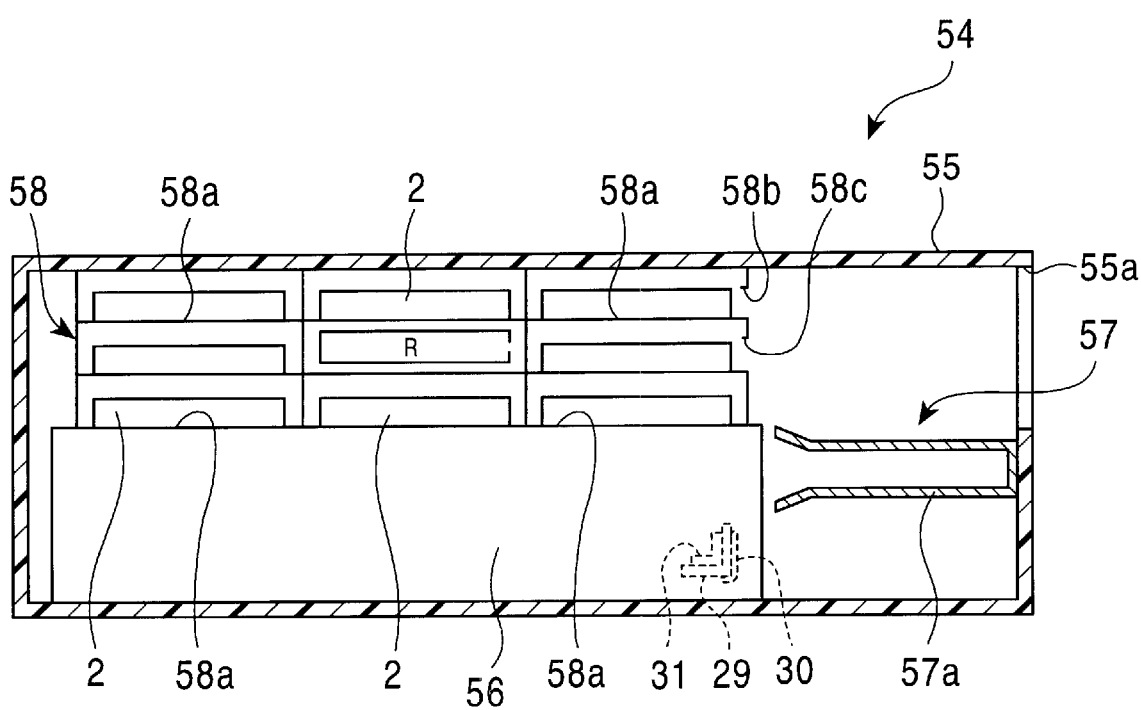
FIG. 16 is a schematic longitudinal sectional view showing an automatic loader having the read/write mechanism.
Figure 17:
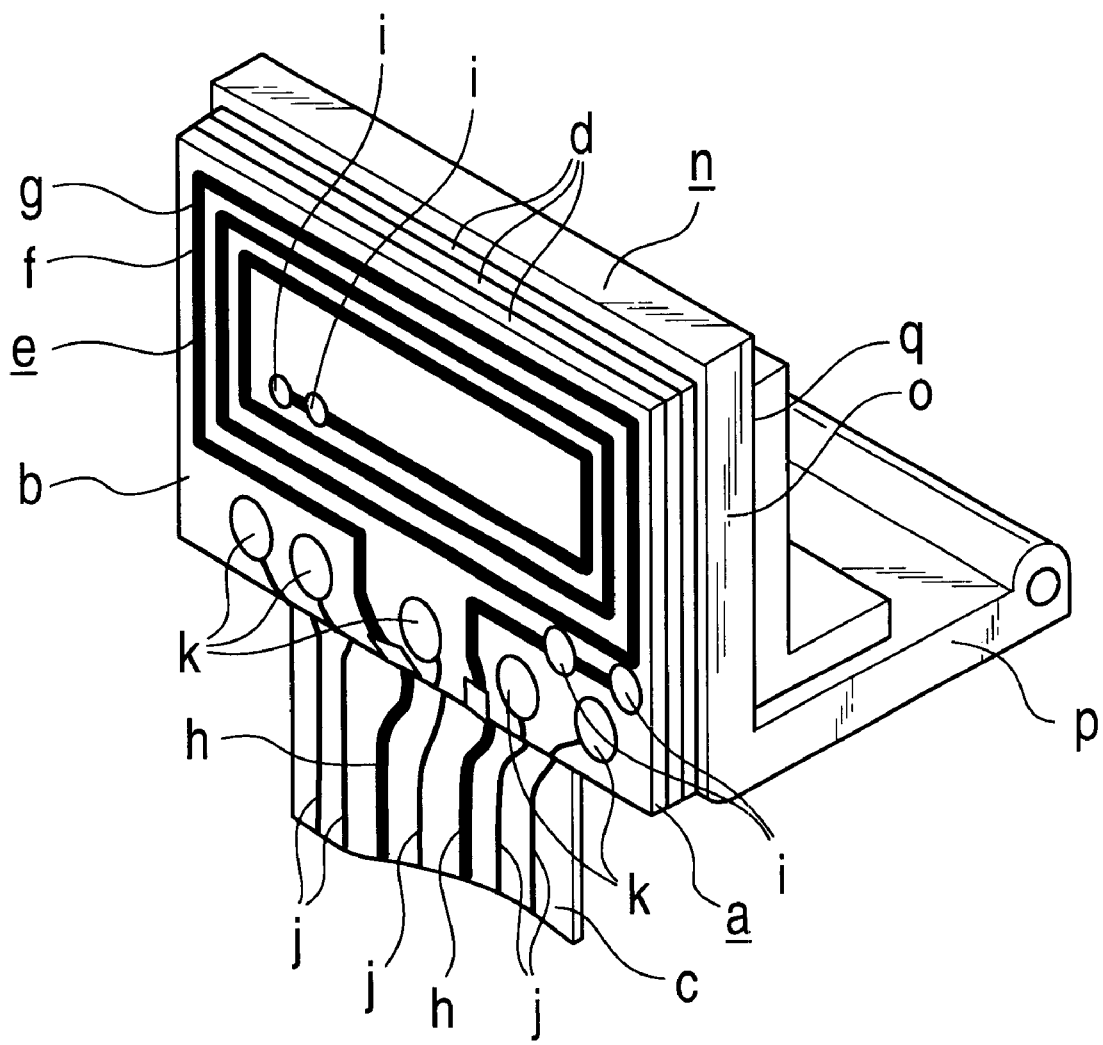
FIG. 17 is an enlarged perspective view showing a conventional transformer.
Figure 18:
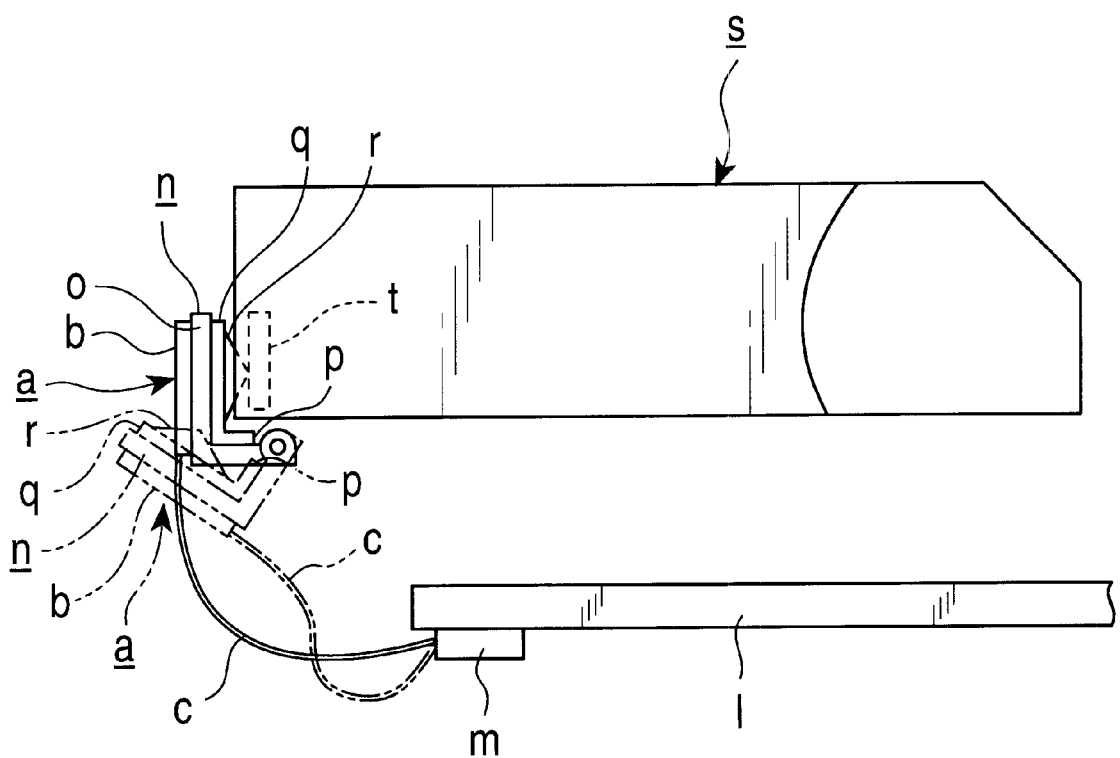
FIG. 18 is a schematic view showing a manner in which a holder having the conventional transformer is operated.

FIG. 16 illustrates the case that the read/write mechanism is provided in an automatic loader.

The automatic loader 54 comprises a drive 56 and a transfer mechanism 57, which are provided in a casing 55. A magazine 58 containing tape cassettes 2, 2, . . . , 2 is inserted into the casing 55. The tape cassettes 2, 2, . . . , 2 are continuously exchanged by the transfer mechanism 57 between the magazine 58 and the drive 56.

An insertion/removal hole 55a for inserting and removing the magazine 58 is formed in the casing 55. The drive 56 is placed in the casing 55. This drive 56 is similar to the aforementioned tape streamer drive 6 and has the read/write mechanism 28 containing the transformer 30 and the connector 31.

The movement case 57a of the movement mechanism 57 is upwardly and downwardly movably supported in the casing 55. A portion, which is at the side of the drive 56, of the movement case 57a is opened.

Accommodating parts 58a, 58a, . . . , 58a for accommodating the tape cassettes 2, 2, . . . , 2, respectively, are formed in the magazine 58, except the central portion thereof. The tape cassettes 2, 2, . . . , 2 can be circulated among the accommodating parts 58a, 58a, . . . , 58a, for example, in a direction of an arrow R indicated in FIG. 16. Further, for instance, the tape cassettes 2, 2, . . . , 2 are inserted from an insertion port 58b formed correspondingly to the accommodating part 58a that is placed upwardly and rightwardly, as viewed in FIG. 16. These tape cassettes 2, 2, . . . , 2 are discharged from a discharging port 58c formed under the insertion port 58b.

Thus, when the movement case 57a moves and is placed correspondingly to the discharging port 58c, one of the tape cassettes 2, 2, . . . , 2 is discharged from the discharging port 58c and inserted into the movement case 57a which is then downwardly moved and which is placed correspondingly to the insertion/removal port of the drive 56. Thus, the tape cassette 2 is inserted into the drive 56. Further, the system is put into a state in which the read/write mechanism 28 can read an information signal from and write an information signal to the memory 2d of the inserted tape cassette 2.

When the inserted tape cassette 2 is discharged from the drive 56 and the tape cassette 2 is inserted into the movement case 57a again, the movement case 57a is upwardly moved and placed correspondingly to the insertion port 58b. Subsequently, the tape cassette 2 placed in the movement case 57a is inserted from the insertion port 58b into the accommodating part 58a. The tape cassettes 2, 2, . . . , 2 are automatically moved to the adjoining accommodating parts 58a, 58a, . . . , 58a in such a way as to be circulated in the direction of the arrow R.

Further, the following operation is repeatedly performed. Namely, the movement case 57a is moved again and positioned at a place corresponding to the discharging port 58c. A tape cassette 2 is then discharged from the discharging port 58c and inserted to the movement case 57a. Thus, this tape cassette 2 is inserted into the drive 56.

The continuous recording and reproducing of information signals can be achieved on a plurality of tape cassettes 2, 2, . . . , 2 by sequentially inserting the tape cassettes, which are contained in the magazine 58, into the drive 56 in the aforementioned manner.

Incidentally, the magazine 58 can be inserted into and removed from the casing 55. Thus, the tape cassettes 2, 2, . . . , 2 can be exchanged by accommodating different tape cassettes 2, 2, . . . , 2 into the magazine 58.

Thus, information can be serially and continuously read from and written to the memories 2d, 2d, . . . , 2d of a plurality of tape cassettes 2, 2, . . . , 2 by providing the read/write mechanism 28 in the automatic loader 54. Consequently, the operating time is reduced.

Incidentally, the aforementioned automatic loader 54 may be provided instead of the tape streamer drive 6 of the cassette library system 1.

Further, each of the transformers 30 explained in the foregoing description made with reference to FIGS. 12 to 16 is formed by using only flexible printed substrates and thus reduced in thickness. Consequently, the communication distance is set at 20 mm or less.

Although the preferred embodiments of the present invention have been described above, it should be understood that the description of practical shape and structure of each of parts of the preferred embodiment of the present invention is for illustrative purposes only, that the scope of the present invention should not be interpreted as being limited thereto and that other modifications will be apparent to those skilled in the art without departing from the spirit of the invention.

The scope of the present invention, therefore, should be determined solely by the appended claims.

What is claimed is:

1. A transformer for reading information from and writing information to a memory included in a recording medium cassette, comprising:

a plurality of flexible printed substrates each having a predetermined circuit pattern and a connecting portion for connection to an external circuit;

lands for connector terminals, for reading information from and writing information to the memory, wherein upon acctuation of the transformer, the lands are in contact with connector terminals of the memory, wherein a multi-layer substrate is formed by stacking said plurality of flexible printed substrates in parallel form such that said plurality of flexible printed substrates are lined up one next to another and wherein upon actuation of the transformer, the connecting portion is deformed by flexing.

2. The transformer according to claim 1, wherein a communication distance being the distance between said memory and said transformer, in which operations of reading information from and writing information to said memory are permitted, is set at 20 mm or less.

3. A cassette library system capable of operating with recording medium cassettes with contact type memory and non-contact type memory, including:

a receiving portion for externally receiving a recording medium cassette;

a discharging portion for externally discharging a said recording medium cassette;

an accommodating rack having a plurality of accommodating portions and wherein said accommodating rack is adapted to accommodate said recording medium cassette in said plurality of accommodating portions;

a conveyance portion for conveying said recording medium cassette to a predetermined position; and a drive unit, loaded with said recording medium cassette, for recording information on and reproducing information from said recording medium cassette, a required one of said recording medium cassettes accommodated in said accommodating rack being taken out therefrom and used, said cassette library system comprising:

a transformer adapted to read information from and write information to a memory included in said recording medium cassette, having lands for connector terminals, for reading information from and writing information to the memory, wherein upon actuation of the transformer, the lands are in contact with connector terminals of the memory, and formed as a multi-layer substrate by stacking a plurality of flexible printed substrates each having a predetermined circuit pattern and having a connecting portion for connection to an external circuit wherein upon actuation of the transformer, the connecting portion is deformed by flexing.

4. The cassette library system according to claim 3, wherein said transformer is positioned corresponding to each of said accommodating portions provided in said accommodating rack.

5. The cassette library system according to claim 3, wherein said transformer is provided in a conveyance mechanism.

6. The cassette library system according to claim 3, wherein a cassette transfer mechanism for transferring said recording medium cassette to each of predetermined portions is provided in said conveyance mechanism, and wherein said transformer is provided in said cassette transfer mechanism.

7. The cassette library system according to claim 3, wherein said conveyance mechanism comprises a transformer placing member adapted to move in a direction in which said transformer placing member moves away from or towards said accommodating rack, and wherein said transformer placing member includes a plurality of transformers positioned respectively corresponding to said recording medium cassettes in a direction in which said recording medium cassettes in said accommodating rack are placed side by side.

8. The cassette library system according to claim 3, wherein a door element for opening and closing an inlet of said receiving portion is provided at said inlet of said receiving portion.

9. The cassette library system according claim 3, which further comprises an automatic loader having:

a casing;

said drive unit placed in said casing;

accommodating parts, adapted to be inserted into and removed from said casing, for separately accommodating a plurality of said recording medium cassettes therein;

a magazine for enabling each of said recording medium cassettes to sequentially move to an adjacent one of said accommodating parts, wherein said transformer is provided in said drive unit of said automatic loader.

10. The cassette library system according to claim 3, wherein a communication distance being the distance between said memory and said transformer, in which operations of reading information from and writing information to said memory are permitted, is set at 20 mm or less.

* * * * *